United States Patent
Wang

Patent Number: 5,780,105
Date of Patent: Jul. 14, 1998

[54] METHOD FOR UNIFORMLY COATING A SEMICONDUCTOR WAFER WITH PHOTORESIST

[75] Inventor: Li-Ming Wang, Ping Tung, Taiwan

[73] Assignee: Vanguard International Semiconductor Corporation, Hsinchu, Taiwan

[21] Appl. No.: 904,082

[22] Filed: Jul. 31, 1997

[51] Int. Cl.$^6$ ........................................ B05D 3/12
[52] U.S. Cl. .................. 427/240; 427/336; 427/352; 427/385.5; 437/231
[58] Field of Search ............... 427/240, 385.5, 427/336, 352; 437/231

[56] References Cited

U.S. PATENT DOCUMENTS

| | | | |
|---|---|---|---|
| 5,405,813 | 4/1995 | Rodrigues | 427/240 |
| 5,677,001 | 10/1997 | Wang | 427/240 |

*Primary Examiner*—Janyce Bell
*Attorney, Agent, or Firm*—Christensen, O'Connor Johnson & Kindness PLLC

[57] ABSTRACT

A method for coating a semiconductor wafer with a high-viscosity photoresist that requires a seven-phase coating process which uses a large diameter dispenser nozzle is disclosed. In this first phase, the photoresist is dispensed onto a slow rotating wafer. In the second phase, this slow rotation phase is continued for a short time after the photoresist is dispensed. In the third phase, the wafer rotational speed is increased to a second value for a short duration. In the fourth phase, the rotational speed is again increased to a third high value for a long duration. In the fifth phase, the rotational speed is decreased to a fourth value and the backside of the wafer is rinsed for a short time period to remove any photoresist that may have migrated to the backside. In the sixth phase, the wafer is rotated at the fourth speed value for another short time period. Finally, the rotation of the wafer is stopped for about a second before being removed from the photoresist coating system.

22 Claims, 3 Drawing Sheets

METHOD FOR UNIFORMLY COATING A SEMICONDUCTOR WAFER WITH PHOTORESIST

FIELD OF THE INVENTION

The present invention relates to a method for coating a semiconductor wafer with a photoresist material, and more particularly, to a method for uniformly coating a semiconductor wafer with a photoresist material through a series of process steps, while using a large diameter nozzle.

BACKGROUND OF THE INVENTION

Semiconductor devices are fabricated in silicon substrates in regions which are precisely defined. These regions on the silicon substrates are then precisely connected to form very large scale integrated (VLSI) circuits. The patterns that define those regions are created by photolithographic processes. A conventional process uses first spin-coating photoresist materials onto the wafer surface. The photoresist layer is then selectively exposed, for example, to ultraviolet light, thereby forming the patterns in the photoresist when the exposed areas are developed. The nature and the thickness of the photoresist determine the precise dimensions of patterns formed. Therefore, the lateral dimensions of the pattern vary according to the thickness of the photoresist. These fluctuations in device dimensions cause defects in semiconductor chips.

FIG. 1A shows a cross section of a semiconductor wafer 10 having a nonuniform photoresist layer 12 formed on the semiconductor wafer 10. This bowl-shaped layer of the photoresist 12 is thicker at the edges of the semiconductor wafer 10 than at the center of the semiconductor wafer 10. The photoresist 12 preferably exceeds a thickness 14 at the edges of the semiconductor wafer 10 to obtain a desirable thickness 14 in the center of the semiconductor wafer 10. As a result, critical dimension (CD), such as a linewidth at a polysilicon layer varies on the same wafer through a photolithographic process due to the variations in the thickness of the photoresist layer 12.

FIG. 1B shows a cross section of a semiconductor wafer 16 having a nonuniform photoresist layer 18 formed on the semiconductor wafer 16. The photoresist layer 18 is thicker at the center of the wafer 16 than at the edges of the wafer 16. The photoresist 18 preferably exceeds the thickness of a height 19 at the edges of the semiconductor wafer 16 to obtain a desirable thickness in the height 19 in the center of the semiconductor wafer 16. As a result, this variation in the thickness of the photoresist layer 18 adversely affects subsequent processing steps.

FIG. 2 shows a simplified view of a conventional coating system. In this coating system, a vacuum chuck 20 has a spindle 22 centrally attached. The spindle 22 rotates the vacuum chuck 20 as indicated by the arrow. A semiconductor wafer 24 has its back surface mounted on the vacuum chuck 20 so that the active surface of the semiconductor wafer 24 is horizontally facing upwards. A photoresist dispensing nozzle 26 is centrally located above the front surface of the semiconductor wafer 24. During a typical operation, photoresist is dispensed through the nozzle 26 onto the semiconductor wafer 24.

Negative-type photoresists are often used in semiconductor fabrication process. Conventional negative-photoresist coating methods generally dispense the photoresist onto the central portion of a stationary wafer through a 3 mm dispenser nozzle. The wafer is then rotated so that centripetal forces causing the photoresist to move towards the outer edge of the wafer, thereby coating the wafer. A negative-type photoresist, such as polyimide precursor, tends to have a high viscosity and, thus requires a relatively long time to complete coating the wafer. Consequently, the process time is longer. The polyimide precursor photoresist also tends to have a relatively poor uniformity, which affects the reliability of the resulting semiconductor devices. Thus, there is a need for a method of quickly coating a wafer with a negative-type photoresist while increasing uniformity.

SUMMARY OF THE INVENTION

In accordance with the present invention, a method for coating a wafer with a high-viscosity photoresist is provided. In one embodiment, a seven-phase coating process utilizes a relatively large diameter dispenser nozzle to dispense the photoresist. In the first phase, the photoresist is dispensed onto a relatively slowly rotating wafer (e.g., 50–200 rpm). In the second phase, this slow rotation phase is continued for a relatively short time (e.g., 10–15 seconds) after the photoresist is dispensed. In the third phase, the wafer rotational speed is increased to a second value (e.g., 1000 rpm) for a relatively short duration (e.g., 10 seconds). In the fourth phase, the rotational speed is again increased to a third relatively high value (e.g., 2500 rpm) for a relatively long duration (e.g., 30 seconds). In the fifth phase, the rotational speed is decreased to a fourth value (e.g., 1500 rpm) and the backside of the wafer is rinsed for a relatively short time period (e.g., 5 seconds) to remove any photoresist that may have migrated to the backside. In the sixth phase, the wafer is rotated at the fourth speed value for another short time period (e.g., 5 seconds). Finally, the rotation of the wafer is stopped for about a second before being removed from the photoresist coating system. Because a large diameter of the nozzle is used in this embodiment, the amount of photoresist is more quickly dispensed onto the wafer, thereby reducing the processing time. In addition, it has been observed that the uniformity of the photoresist coating is increased by using a large diameter nozzle, even in a conventional process. Moreover, because the photoresist was dispensed while the wafer was rotating, the uniformity of the coating is further increased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
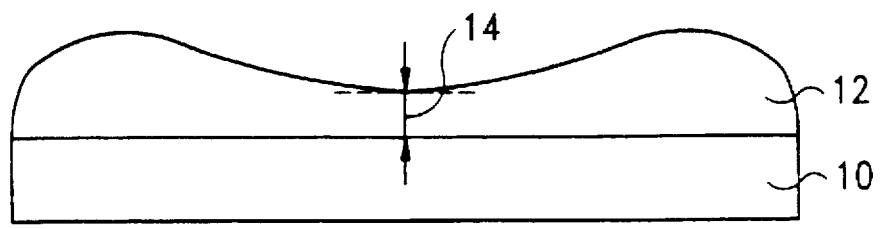
FIG. 1A shows a cross section of a semiconductor wafer forming a nonuniform photoresist layer.
Figure 1B:
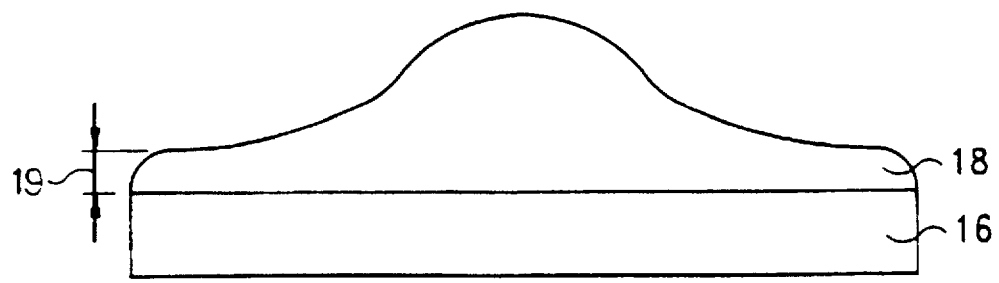
FIG. 1B shows another cross section of a semiconductor wafer forming a non-uniform photoresist layer.
Figure 2:
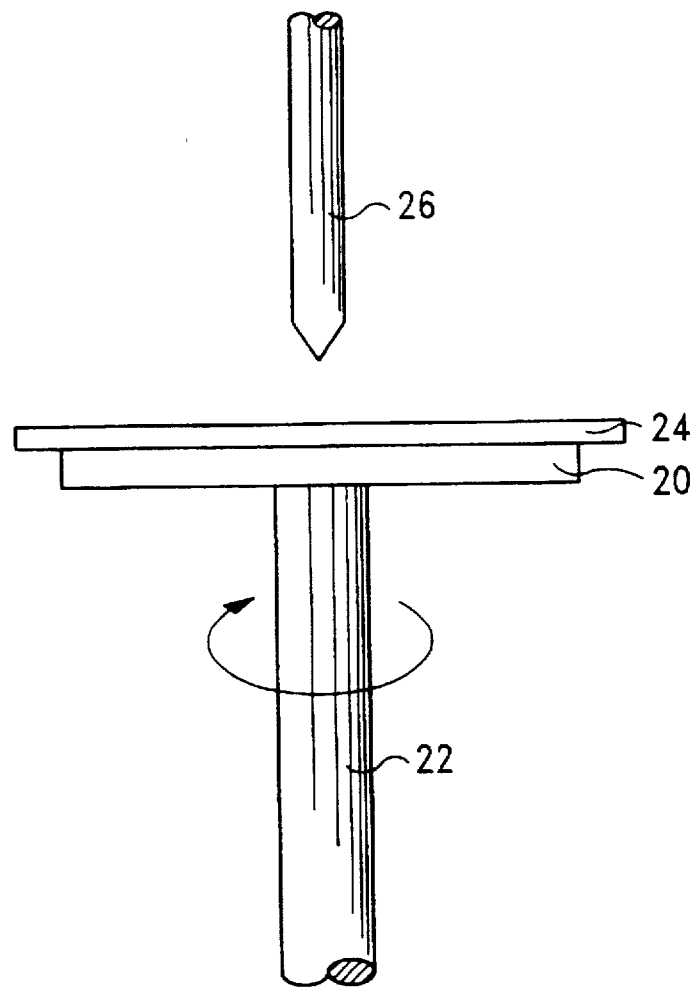
FIG. 2 shows a simplified view of a conventional coating system.
Figure 3:
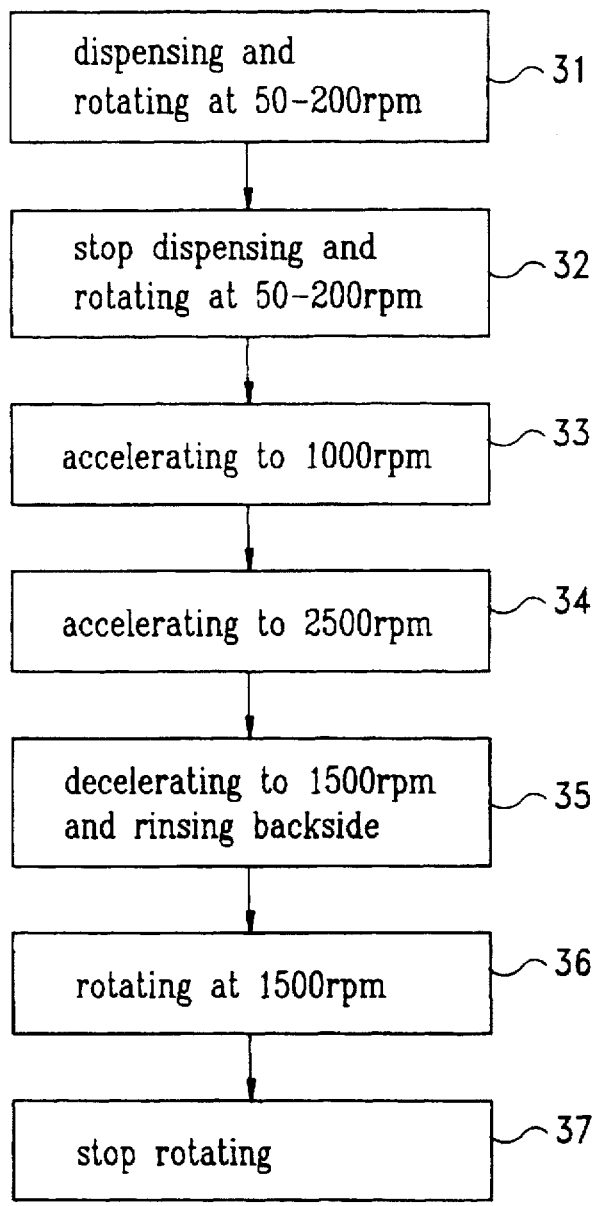
FIG. 3 shows a flow diagram illustrating a method for uniformly coating a wafer with a negative-type photoresist.

FIG. 3 shows a flow diagram illustrating a method of uniformly coating a wafer with a negative-type photoresist, such as polyimide precursor. In one embodiment, a seven-phase coating process uses a larger diameter dispenser nozzle to dispense the negative-type photoresist. The nominal inner diameter of the dispensing nozzle is about 6 mm. However, the dispensing nozzle having an inner diameter in the range of about 4–8 mm can be used, compared to the conventional dispensing nozzle having an inner diameter of 3 mm The photoresist used in this embodiment is polyimide precursor I-8320A, manufactured by Asahi Chemical corporation, Japan, and its viscosity is about 3000 centipoise (cp) at 23° C.

Referring to FIG. 3, at a first phase 31, the photoresist is dispensed onto a relatively slow rotating wafer, which is rotated at a speed in the range of about 50–200 rpm. Contrary to the conventional polyimide precursor photoresist coating method, the photoresist is dispensed through a 6 mm dispenser nozzle onto a slowly rotating wafer in the present invention, thereby reducing the time needed to complete coating the wafer. In addition, the shape of the dispensed photoresist is more uniform than that of a stationary wafer in the prior art. More specifically, the dispensed photoresist in the prior art is thicker at the center of the wafer than at the edges of the wafer.

After the dispensing of the photoresist is stopped at the end (about 10 seconds) during the first phase 31, the rotation of the wafer is continued for a short time (e.g., 10–15 seconds). A second phase 32 is used to verify that the photoresist dispensed on the wafer during the first phase 31 achieves a more uniform shape than the previous phase. In a third phase 33, the wafer rotational speed is increased to a second value of about 1000 rpm for a short duration of about 10 seconds. The third phase 33 is used to spin the high-viscosity photoresist to thoroughly cover the wafer surface.

Figure 4:
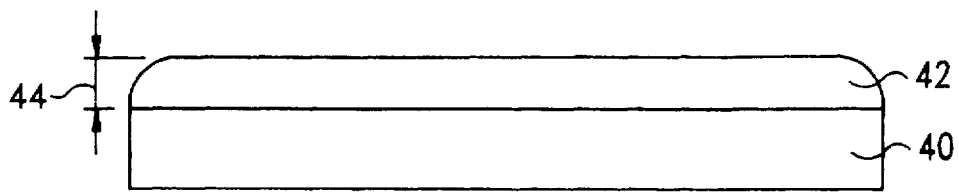
FIG. 4 shows a cross section of the semiconductor wafer forming a layer of photoresist at the end of the fourth phase in accordance with the method of the present invention.

In a fourth phase 34, the rotational speed is again accelerated to a third high value of about 2500 rpm for a relatively long duration of about 30 seconds. The thickness of the photoresist layer is formed and determined at the end of the fourth phase 34. FIG. 4 shows a cross section of a semiconductor wafer 40 having a layer of a photoresist 42 formed at the end of the fourth phase 34 in accordance with the method of the present invention. The photoresist layer 42 has a substantially uniform thickness 44 across the entire surface of the semiconductor wafer 40.

During a fifth phase 35, the rotational speed is decelerated to a fourth value of about 1500 rpm for a relatively short time period of about 5 seconds. In this phase 35, the backside of the wafer is rinsed to remove any photoresist that may have migrated to the backside. In a sixth phase 36, the wafer is rotated at the same speed as that in the fifth phase 35, for another short time period of about 5 seconds. This phase 36 is primarily used to spin dry the rinse solvent remaining on the backside of the wafer.

Finally, in a seventh phase 37, the rotation of the wafer is stopped for about a second before the wafer is removed from the photoresist coating system. Because a large diameter of the nozzle is used in this embodiment, a given amount of photoresist is more quickly dispensed onto the wafer, thereby reducing the processing time. In addition, it has been observed that the uniformity of the photoresist coating is increased by using a larger diameter nozzle, even in a conventional process. Moreover, because the photoresist was dispensed while the wafer was rotated in the first phase 31, the uniformity of the coating is further increased.

Table 1 below shows some experimental results demonstrating the improvement achieved by using the present invention, where the range represents the difference of thickness between the thickest portion and the thinnest portion of the photoresist layer formed.

TABLE 1

| Speed in the First Phase (rpm) | Inner Diameter of Nozzle (mm) | Range (angstrom) | Standard Deviation (angstrom) |
|---|---|---|---|
| 0 | 3 | 6010 | 1921.2 |
| 100 | 3 | 4083 | 1328.7 |
| 100 | 6 | 3801 | 977.4 |

The data from the first row in Table 1 correspond to a conventional coating method. The data from the second row in Table 1 correspond to one embodiment in the present invention, in which a rotational speed of 100 rpm in the first phase is used, and a nozzle of a conventional size is used. The numerical deviation as indicated by the first and second rows in Table 1 shows the amount of improved uniformity of the photoresist Furthermore, the data from the third row in Table 1 correspond to another embodiment of the present invention, in which a rotational speed of 100 rpm in the first phase is used, and a large size (6 mm) of nozzle is used. By comparing the data of the range and the deviation to those of the first and second rows, uniformity of the photoresist layer is further improved.

Although specific embodiments have been illustrated and described, it will be obvious to those skilled in the art that various modifications may be made without departing from the spirit which is intended to be limited solely by the appended claims.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for uniformly coating a semiconductor wafer with a photoresist material, comprising the steps of:

rotating the semiconductor wafer about a central axis at a first rotational speed while concurrently dispensing the photoresist material onto a top surface of the semiconductor wafer;

ceasing dispensing said photoresist material and maintaining said semiconductor wafer at the first rotational speed;

accelerating said semiconductor wafer from the first rotational speed to a second rotational speed;

accelerating said semiconductor wafer from the second rotational speed to a third rotational speed in determining the thickness of the photoresist material on said semiconductor wafer;

decelerating said semiconductor wafer from the third rotational speed to a fourth rotational speed while concurrently rinsing a back surface of said semiconductor wafer;

maintaining said semiconductor wafer at the fourth rotational speed; and stopping said semiconductor wafer before removing said semiconductor wafer.

2. The method according to claim 1, wherein said rotating step in rotating said semiconductor wafer is in the range of about 50–200 rpm.

3. The method according to claim 2, wherein said rotating step in rotating said semiconductor wafer at the first rotational speed is for about 10 seconds.

4. The method according to claim 1, wherein said maintaining step at the first rotational speed is for about 10–15 seconds.

5. The method according to claim 1, wherein said second rotational speed in the step of accelerating said semiconductor wafer is for about 1000 rpm.

6. The method according to claim 5, wherein said step of accelerating said semiconductor wafer to the second rotational speed is for about 10 seconds.

7. The method according to claim 1, wherein said third rotational speed in the step of accelerating said semiconductor wafer is for about 2500 rpm.

8. The method according to claim 7, wherein said step of accelerating said semiconductor wafer to the third rotational speed is for about 30 seconds.

9. The method according to claim 1, wherein said fourth rotational speed in the step of decelerating said semiconductor wafer is for about 1500 rpm.

10. The method according to claim 9, wherein said step of decelerating said semiconductor wafer is for about 5 seconds.

11. The method according to claim 1, wherein said step of maintaining said semiconductor wafer at the fourth rotational speed is for about 5 seconds.

12. The method according to claim 1, wherein said step of stopping said semiconductor wafer is for about a second before removing the semiconductor wafer.

13. The method according to claim 1, wherein said photoresist material is dispensed through a dispensing nozzle having an inner diameter in the range of about 4 to 8 mm.

14. A method for uniformly coating a semiconductor wafer with a photoresist material, comprising the steps of:

rotating the semiconductor wafer about a central axis at a first rotational speed in the range of about 50–200 rpm while concurrently dispensing the photoresist material onto a top surface of the semiconductor wafer;

ceasing dispensing said photoresist material and maintaining said semiconductor wafer at the first rotational speed;

accelerating said semiconductor wafer from the first rotational speed to a second rotational speed of about 1000 rpm;

accelerating said semiconductor wafer from the second rotational speed to a third rotational speed of about 2500 rpm in determining the thickness of the photoresist material on said semiconductor wafer;

decelerating said semiconductor wafer from the third rotational speed to a fourth rotational speed of about 1500 rpm while concurrently rinsing a back surface of said semiconductor wafer;

maintaining said semiconductor wafer at the fourth rotational speed; and stopping said semiconductor wafer before removing said semiconductor wafer.

15. The method according to claim 14, wherein said rotating step at the first rotational speed is for about 10 seconds.

16. The method according to claim 14, wherein said step of maintaining said semiconductor wafer at the first rotational speed is for about 10–15 seconds.

17. The method according to claim 14, wherein said step of accelerating said semiconductor wafer to the second rotational speed is for about 10 seconds.

18. The method according to claim 14, wherein said step of accelerating said semiconductor wafer to the third rotational speed is for about 30 seconds.

19. The method according to claim 14, wherein said step of decelerating said semiconductor wafer is for about 5 seconds.

20. The method according to claim 14, wherein said step of maintaining said semiconductor wafer at the fourth rotational speed is for about 5 seconds.

21. The method according to claim 14, wherein said step of stopping said semiconductor wafer is for about a second before removing the semiconductor wafer.

22. The method according to claim 14, wherein said photoresist material is dispensed through a dispensing nozzle having an inner diameter in the range of about 4 to 8 mm.

* * * * *